(12) United States Patent
Deffler

(10) Patent No.: US 7,734,457 B2
(45) Date of Patent: Jun. 8, 2010

(54) METHOD AND SYSTEM FOR GENERATING DYNAMIC COMPARISON MODELS

(75) Inventor: Tad A. Deffler, Boonton, NJ (US)

(73) Assignee: Computer Associates Think, Inc., Islandia, NY (US)

(*) Notice: Subject to any disclaimer, the term of this patent is extended or adjusted under 35 U.S.C. 154(b) by 285 days.

(21) Appl. No.: 11/379,197

(22) Filed: Apr. 18, 2006

(65) Prior Publication Data

US 2006/0225030 A1 Oct. 5, 2006

Related U.S. Application Data

(63) Continuation-in-part of application No. 10/890,313, filed on Jul. 12, 2004, which is a continuation-in-part of application No. 09/420,223, filed on Oct. 16, 1999, now Pat. No. 6,859,919.

(51) Int. Cl.
*G06F 17/50* (2006.01)
*G06F 9/44* (2006.01)

(52) U.S. Cl. ............................ 703/13; 717/104; 717/136
(58) Field of Classification Search .................. 703/13; 717/104, 136
See application file for complete search history.

(56) References Cited

U.S. PATENT DOCUMENTS

| 3,656,178 A | 4/1972 | De Maine et al. ............... 444/1 |
| 4,667,290 A | 5/1987 | Goss et al. ................... 364/300 |
| 4,787,035 A | 11/1988 | Bourne ........................ 700/247 |
| 4,931,928 A | 6/1990 | Greenfeld ................... 717/131 |
| 4,949,253 A | 8/1990 | Chigira et al. ............... 717/107 |
| 5,070,534 A | 12/1991 | Lascelles et al. ............. 715/764 |
| 5,245,675 A | 9/1993 | Ferre et al. ..................... 382/27 |
| 5,257,363 A | 10/1993 | Shapiro et al. .............. 395/500 |
| 5,276,880 A | 1/1994 | Platoff et al. ................. 717/143 |
| 5,295,059 A | 3/1994 | Brooks et al. ................. 700/18 |
| 5,295,256 A | 3/1994 | Bapat ........................ 717/137 |

(Continued)

FOREIGN PATENT DOCUMENTS

EP 0 396 310 5/1990

(Continued)

OTHER PUBLICATIONS

Rich Hickey, "Callbacks in C++ Using Template Functors", http://www.tutok.sk/fastgl/callback.html, 1994, pp. 1-17.*

(Continued)

*Primary Examiner*—Kamini S Shah
*Assistant Examiner*—David Silver
(74) *Attorney, Agent, or Firm*—Baker Botts L.L.P.

(57) ABSTRACT

The present invention is directed to a method and system that includes comparing first and second models. A comparison model may be generated that indicates differences between the first model and the second model. A notification manager is used to register the comparison model as a subscriber of the first and second models. The first model is updated to reflect a first designated change. Upon successful completion of the first designated change, the notification manager is used to issue a notification of the designated change to the first model. At least the comparison model is updated to reflect the first designated change, and the comparison model is displayed on a client.

20 Claims, 5 Drawing Sheets

U.S. PATENT DOCUMENTS

| | | | |
|---|---|---|---|
| 5,421,016 A | 5/1995 | Conner et al. | 395/700 |
| 5,481,718 A | 1/1996 | Ryu et al. | 395/700 |
| 5,495,613 A | 2/1996 | Brody | 717/110 |
| 5,513,314 A | 4/1996 | Kandasamy et al. | 714/6 |
| 5,517,641 A | 5/1996 | Barry et al. | 707/101 |
| 5,548,758 A | 8/1996 | Pirahesh et al. | 707/2 |
| 5,550,971 A | 8/1996 | Brunner et al. | 375/161 |
| 5,596,746 A | 1/1997 | Shen et al. | 707/101 |
| 5,638,381 A | 6/1997 | Cho et al. | 371/22.4 |
| 5,644,764 A | 7/1997 | Johnson et al. | 395/614 |
| 5,649,203 A | 7/1997 | Sites | 717/156 |
| 5,692,195 A | 11/1997 | Conner et al. | 395/685 |
| 5,694,539 A | 12/1997 | Haley et al. | 714/38 |
| 5,699,310 A | 12/1997 | Garloff et al. | 395/701 |
| 5,701,487 A | 12/1997 | Arbouzov | 717/124 |
| 5,715,453 A | 2/1998 | Stewart | 395/615 |
| 5,717,924 A | 2/1998 | Kawai | 395/613 |
| 5,721,895 A | 2/1998 | Velissaropoulos et al. | 395/600 |
| 5,721,915 A | 2/1998 | Sockut et al. | 707/200 |
| 5,721,925 A | 2/1998 | Cheng et al. | 395/683 |
| 5,721,929 A | 2/1998 | Pasquariello | 717/168 |
| 5,724,425 A | 3/1998 | Chang et al. | 380/25 |
| 5,732,192 A | 3/1998 | Malin et al. | 395/10 |
| 5,734,907 A | 3/1998 | Jarossay et al. | 717/141 |
| 5,737,592 A | 4/1998 | Nguyen et al. | 707/4 |
| 5,742,828 A | 4/1998 | Canady et al. | 717/144 |
| 5,761,494 A | 6/1998 | Smedley et al. | 707/4 |
| 5,764,978 A | 6/1998 | Masumoto | 707/100 |
| 5,768,586 A | 6/1998 | Zweben et al. | 395/653 |
| 5,790,861 A | 8/1998 | Rose et al. | |
| 5,794,229 A | 8/1998 | French et al. | 707/2 |
| 5,802,511 A | 9/1998 | Kouchi et al. | 707/2 |
| 5,815,415 A | 9/1998 | Bentley et al. | 703/4 |
| 5,822,750 A | 10/1998 | Jou et al. | 707/2 |
| 5,855,014 A | 12/1998 | Smith | 707/3 |
| 5,857,197 A | 1/1999 | Mullins | 707/103 R |
| 5,878,411 A | 3/1999 | Burroughs et al. | 707/4 |
| 5,905,982 A | 5/1999 | Carey et al. | 707/4 |
| 5,974,201 A | 10/1999 | Chang et al. | 382/305 |
| 5,974,253 A | 10/1999 | Nahaboo et al. | 395/701 |
| 5,974,407 A | 10/1999 | Sacks | 707/2 |
| 5,978,789 A | 11/1999 | Griffin et al. | 707/2 |
| 5,983,016 A | 11/1999 | Brodsky et al. | 395/701 |
| 5,987,123 A | 11/1999 | Scott et al. | 380/4 |
| 6,003,037 A | 12/1999 | Kassabgi et al. | 707/103 |
| 6,011,917 A | 1/2000 | Leymann et al. | 395/702 |
| 6,031,993 A | 2/2000 | Andrews et al. | 717/143 |
| 6,052,720 A | 4/2000 | Traversat et al. | 709/220 |
| 6,065,002 A | 5/2000 | Knotts et al. | 707/4 |
| 6,081,774 A | 6/2000 | de Hita et al. | 704/9 |
| 6,085,120 A | 7/2000 | Schwerdtfeger et al. | 700/90 |
| 6,091,895 A | 7/2000 | Govindaraj | 395/702 |
| 6,105,043 A | 8/2000 | Francisco et al. | 715/513 |
| 6,112,024 A | 8/2000 | Almond et al. | 395/703 |
| 6,112,304 A | 8/2000 | Clawson | 713/156 |
| 6,112,649 A | 9/2000 | Jeong | 99/492 |
| 6,114,978 A | 9/2000 | Hoag | 341/23 |
| 6,182,274 B1 | 1/2001 | Lau | 717/1 |
| 6,226,792 B1 | 5/2001 | Goiffon et al. | 717/11 |
| 6,243,709 B1 | 6/2001 | Tung | 707/103 R |
| 6,247,020 B1 | 6/2001 | Minard | 707/104 |
| 6,292,811 B1 | 9/2001 | Clancey et al. | 707/503 |
| 6,374,252 B1 | 4/2002 | Althoff et al. | 707/102 |
| 6,374,256 B1 | 4/2002 | Ng et al. | 707/103 R |
| 6,385,610 B1 | 5/2002 | Deffler et al. | 707/6 |
| 6,385,767 B1 | 5/2002 | Ziebell | 717/11 |
| 6,446,109 B2 | 9/2002 | Gupta | 709/203 |
| 6,453,356 B1 | 9/2002 | Sheard et al. | 709/231 |
| 6,502,234 B1 | 12/2002 | Gauthier et al. | 717/107 |
| 6,513,152 B1 | 1/2003 | Branson et al. | 717/100 |
| 6,601,023 B1 | 7/2003 | Deffler et al. | 703/13 |
| 6,665,677 B1 | 12/2003 | Wotring et al. | 707/100 |
| 6,678,882 B1 * | 1/2004 | Hurley et al. | 717/121 |
| 6,754,671 B2 | 6/2004 | Hrebejk et al. | 707/103 |
| 6,859,919 B1 | 2/2005 | Deffler et al. | 717/100 |
| 7,353,252 B1 * | 4/2008 | Yang et al. | 709/204 |
| 2002/0059446 A1 | 5/2002 | Visalli et al. | 709/236 |
| 2003/0014439 A1 | 1/2003 | Boughannam | 707/513 |
| 2003/0084424 A1 * | 5/2003 | Reddy et al. | 717/105 |
| 2004/0103393 A1 * | 5/2004 | Reddy et al. | 717/122 |
| 2005/0160401 A1 | 7/2005 | Russo et al. | 717/108 |

FOREIGN PATENT DOCUMENTS

| | | |
|---|---|---|
| EP | 1 134 949 A2 | 8/2001 |
| GB | 2 227 339 | 7/1990 |

OTHER PUBLICATIONS

EPO Communication pursuant to Article 94(3), Application No. 99 970 749.0-1243, 4 pages, Nov. 21, 2008.

Borland, Turbo Assembler Version 3.0 User's Guide, Chapter 14, pp. 197-212.

Tanner, "Automating Reports with Microsoft Word," XP-002246675, M.D. Computing, USA, vol. 9, No. 2, pp. 108-113, 1992.

Ying Yang, "Change Management in Object-Oriented Databases," Proceedings of the International Phoenix Conference on Computers and Communications, pp. 238-244, IEEE, US, Mar. 23, 1993, material.

Burnett et al., Visual Object Oriented Programming Concepts and Environments, pp. 1-273, 1994.

Gamma, "Design Patterns," Addison-Wesley, ISBN: 978-0201633610, 10 pages.

Forte Software Inc., Product Forte version 1.0 released Jun. 30, 1994, TOOL Reference Manual—whole manual, Jun. 30, 1994.

Forte Software Inc., Product Forte version 1.0 released Jun. 30, 1994, A Guide to the Forte Workshops—whole manual, Jun. 30, 1994.

Forte Software Inc., Product Forte version 1.0 released Jun. 30, 1994, Framework Project—whole manual, Jun. 30, 1994.

Forte Software Inc., Product Forte version 1.0 released Jun. 30, 1994, System Management Guide—whole manual, Jun. 30, 1994.

Kantorowitz, "Algorithm Simplification Through Object Orientation," Computer Science Department, Technion-Israel Institute of Technology, pp. 1-13, 1995.

Meng et al., "A Theory of Translation from Relational Queries to Hierarchical Queries," IEEE Transactions on Knowledge and Data Engineering, vol. 7, No. 2, pp. 228-245, Apr. 1995.

Rational Rose/C++, Round Trip Engineering with Rational Rose C++, Rational Software Corporation, (RAT-C++), pp. 5-227 plus title and copyright pages, Nov. 1996.

Rational Rose, Using Rational Rose 4.0, Rational Software Corporation, (RAT-UR), 213 pages, Nov. 1996.

Unified Modeling Language UML & Booch & OMT, Quick Reference for Rational Rose 4.0, 10 pages, Nov. 1996.

Orfali et al., Client/Server Programming with JAVA and CORBA Second Edition, pp. 1-60, 331-371, 433-518, 711-830, and 905-932 plus 35 pages of title, preface, acknowledgements, contents, and back page, Jan. 30, 1997.

"Logic Works Releases Beta of Object-Relational Modeling Tool for Universal Server Databases," downloaded from microway.com/au/press/logic_umabeta.htm Informix World-wide User Conference, San Francisco, CA, 3 pages, Jul. 22, 1997.

Douglass, "Designing Real-Time Systems with the Unified Modeling Language," Electronic Design, Penton Publishing, Cleveland, OH, US, pp. 132, 134, 136, 138, 140, 142, and cover, vol. 45, No. 20 Sep. 15, 1997.

Aho et al., Compilers: Principles, Techniques, and Tools, Chapters 1-7 (418 pages).

Cacace et al., "Integrating Object-Oriented Data Modeling With a Rule Based Programming Paradigm," ACM, pp. 225-236, 1990.

Rumbaugh et al., "Object-Oriented Modeling and Design," pp. 69-71, Nov. 14, 1990.

"Information Warehouse: how IBM plans to use its Information Warehouse technology to allow access to data from across IBM platforms—and those of its competitors," (Interview with IBM's Chris Arnold and Willy Chiu) (cover story), DBMS, vol. 5, No. 3, 6 pages, Mar. 1992.

Meng et al., "Construction of a Relational Front-end for Object-Oriented Database Systems," IEEE, pp. 476-483, 1993.

Hsieh et al., "Capturing the Object-Oriented Database Model Relational Form," IEEE, pp. 202-208, 1993.

International PCT Search Report for PCT/US99/23876, filed Oct. 15, 1999, 4 pages, Feb. 9, 2000.

International PCT Search Report for PCT/US99/24115, filed Oct. 15, 1999, 4 pages, Feb. 7, 2000.

EPO Communication, Ref. GAW/KT/J43248EP, 4 pages, Dec. 27, 2002.

Supplementarty EPO Search Report, 4 pages, Aug. 26, 2003.

IBM, MVS Programming: Assembler Services Guide, Second Edition, Chapter 10, Reporting Symptom Records (SYMRBLD and SYMREC Macros), pp. 1-9, Sep. 1996.

McIlroy, "Macro Instruction Extensions of Compiler Languages," ACM, vol. 3, Issue 4, pp. 214-220, plus 4 pages of ACM Portal Digital Library, Apr. 1960.

Notley, "A Model of Extensible Language Systems," ACM, pp. 29-38, plus 2 pages of ACM Portal Digital Library, Sep. 1971.

Sakharov, "Macro Processing in High-Level Languages," ACM, vol. 27, Issue 11, pp. 59-66, plus 2 pages of ACM Portal Digital Library, Nov. 1992.

Raiha, "A Brief Look at Extension Programming Before and Now," ACM, vol. 30, Issue 2, pp. 12-20, plus 2 pages of ACM Portal Digital Library, Feb. 1995.

"The C Book-Keywords and identifiers", pp. 1-3.

Communication from EPO, Application No. 04778238.8-1243/1652074 PCT/2004022633, Jul. 14, 2008.

Engelbert, "An OO interpretation of graphs as meta-CASE's meta-meta-model," pp. 1-10, Sep. 6, 2002.

Medvidovic, "Modeling Software Architectures in the Unified Modeling Language," pp. 1-57, Jan. 2002.

Martin, "Principles of Object-Oriented Analysis and Design," Chapters 5-7 and 10, Jun. 1, 1992.

IDEF Integrated DEFinition Methods, "IDEF1X Data Modeling Method,"4 pages, 2006.

Breton et al., "Towards an Understanding of Model Executablity," pp. 70-80, 2001.

Office Action dated May 23, 2007 for U.S. Appl. No. 10/890,313, May 23, 2007.

CA, "Product Brief; CA Erwin® Data Modeler," pp. 1-7, 2008.

CA, CA Erwin® Data Modeler, 2 pages, 2008.

Dominus, "Perl: Not Just for Web Programming," IEEE, pp. 69-74, Feb. 1998.

Ousterhout, "Scripting: Higher-Level Programming for the 21st Century," IEEE, pp. 23-30, Mar. 1998.

USPTO Office Action, U.S. Appl. No. 09/419,749, Inventor Deffler, 19 pages, Jun. 11, 2009.

Communication pursuant to Article 94(3) EPC, Application No. 04 778 238.8-1243, Ref. No. HCD/J00048582EP, 5 pages, Feb. 16, 2009.

Communication pursuant to Article 94(3) EPC, Application No. 99 953 188.2-1225, Ref. No. HCD/KT/J43277EP, 9 pages, Feb. 4, 2009.

U.S. Appl. No. 09/419,749, entitled "Method and System for Extensible Macro Language," by Tad A. Deffler et al., filed Oct. 16, 1999.

Office Action dated Feb. 7, 2008 for U.S. Appl. No. 10/890,313, 18 pages, Feb. 7, 2008.

Office Action dated May 1, 2008 for U.S. Appl. No. 09/419,749, 13 pages, May 1, 2008.

Office Action dated Sep. 12, 2008 for U.S. Appl. No. 10/890,313, 16 pages, Sep. 12, 2008.

\* cited by examiner

METHOD AND SYSTEM FOR GENERATING DYNAMIC COMPARISON MODELS

RELATED APPLICATION

This application is a Continuation-in-part of U.S. patent application Ser. No. 10/890,313, filed Jul. 12, 2004, entitled "System and Method for Adding User-Defined Objects to a Modeling Tool", which is a Continuation-in-part of U.S. patent application Ser. No. 09/420,223 filed on Oct. 16, 1999, entitled "Object Modeling Tool With Meta Model Semantic Registry (Rules) A Meta Datamanager for Object(s) Properties an Object/Property Interface For Instance(s) of Objects/Properties Received Via Object/Property Interface of the Object Factory Registry", now U.S. Pat. No. 6,859,919, both of which are incorporated by reference into this application.

TECHNICAL FIELD OF THE INVENTION

The present invention relates generally to object models, and more particularly to a method and system for generating dynamic comparison models.

BACKGROUND OF THE INVENTION

Models are often used to help visualize concepts by using symbolic representations. Models may include a group of objects, entities, properties, or attributes. For example, a model may be a category of type "planets." An object within the model may be a specific planet, such as Earth. Properties or attributes within the object may be characteristics, such as size, population, or relative location.

It is often desirable to compare two models to determine any differences between the models. Comparing two different models can help to ensure that the models are synchronized and semantically valid at all times. Existing tools are available that compare different models and identify the differences between the models. For example, a comparison tool called COMPLETE COMPARE™ (available from CA, Inc.) provides one way of comparing models. Previous architectures of the COMPLETE COMPARE™ comparison tool represented the comparison of two models in a set of 'C' (the programming language) structures. These structures maintained the memory address of the two models being compared, and a flag indicating the state of equality between them. Then, the COMPLETE COMPARE™ comparison tool displayed the comparison data. In order to synchronize the models, the user designated data in one model that the user wanted to import into the second model. The changes requested by the user were incorporated in an asynchronous or batch mode, in which the changes were held in a script and executed at the end of the comparison process.

This approach often suffered from side-effects. Side-effects are encountered during the act of bringing data into a target model (e.g., in order to synchronize it with another model). Since side-effects did not become immediately visible to the user in real-time, as the user was indicating the desired changes, this often resulted in changes that the user did not intend. In other cases, side-effects might cause a violation of modeling rules and cause certain actions to fail or result in an invalid model.

SUMMARY OF THE INVENTION

The present invention is related to a system and method for comparing models, and generating a dynamic comparison model that identifies differences between the compared models. The teachings of the present invention also allow a user to utilize the dynamic comparison model to designate changes to one or more of the compared models in order to synchronize aspects of the models and/or synchronize the models entirely.

In accordance with the teachings of the present invention, the process of comparing two models results in a collection of comparison nodes that hold information about the comparison. The comparison nodes may be modeled as an object model using a modeling tool. All operations performed upon the two data models, and all operations performed upon the comparison model, may be performed immediately upon their designation by the user. Side-effects then become more immediately apparent.

In accordance with a particular embodiment of the present invention, a method for generating a dynamic comparison model includes selecting a first model and a second model. The method also includes running a comparison engine on the first model and the second model. Next, the method generates the comparison model based on the inequality between the first model and second model. The method further includes registering the comparison model as a subscriber to the first model and the second model in a notification manager. The notification manager notifies all subscribers of changes that occur to a model. The method further includes displaying the comparison model using a modeling tool.

Technical advantages of particular embodiments of the present invention include a system and method for generating dynamic comparison models that allows a user to view a graphical representation of a comparison of a plurality of models. Thus, differences between the models are easily ascertainable to a user, and the user can more easily identify and implement desired changes to at least one of the models.

Another technical advantage of particular embodiments of the present invention includes a system and method for generating dynamic comparison models that accommodates synchronous modifications to at least one of the models. Accordingly, updates to the target model are made in approximately real time, as the user designates the changes to be made.

Yet another technical advantage of particular embodiments of the present invention includes a system and method for generating dynamic comparison models that allows side-effects to be identified more quickly and easily. Accordingly, a user may correct potential problems caused by side-effects as they arise (i.e., as additional changes are being made), to avoid the potential for the side-effects to impact later changes. Thus, problems caused by side-effects may be reduced or eliminated.

Still another technical advantage of particular embodiments of the present invention includes a system and method for generating dynamic comparison models that interact with a notification manager that broadcasts a list of all changes to the model upon the successful completion of an operation. Therefore, a user is provided with immediate feedback regarding all changes to the models, including those caused by modeling rules instead of user-designated changes.

Still another technical advantage of particular embodiments of the present invention includes a system and method for generating dynamic comparison models that interact with a transaction manager that tracks changes to the model and allows a user to undo and/or redo changes at the click of a button. This feature simplifies and speeds the process of synchronizing models.

Other technical advantages of the present invention will be readily apparent to one skilled in the art from the following figures, descriptions, and claims. Moreover, while specific

DETAILED DESCRIPTION OF THE INVENTION

Figure 1A:
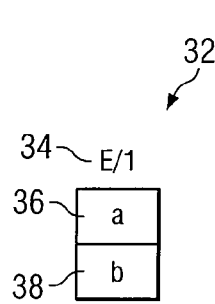
FIG. 1A is an example of a standard object model.

A model is a representation that is often used to help illustrate a concept using symbolic representations. It is often beneficial and/or necessary to compare two models in order to better understand similarities and/or differences between the models. For example, such a comparison is often helpful to synchronize or bring some level of conformity to the models. By comparing two models and identifying any differences between them, a user can more readily make desired changes to one or both models, in order to achieve the desired level of conformity.

Models are typically represented using various hierarchical components. For example, a model may include one or more objects. Each object may include one or more attributes (e.g., properties).

Various types of models are used to illustrate concepts using visual representations. This specification will focus primarily on object models. An object model may include any physical or logical description of data that is to be defined, processed, or retrieved by implemented code (e.g., externally implemented code). An object model typically represents categories of data. Models may be referred to in a variety of different ways and various types of models may benefit from the teachings of the present invention including models, object/property models, data models and schemas (e.g., DBMS schemas and/or any set of objects).

Objects of the model typically represent data belonging to the model. Based on the hierarchical structure of models, objects may own, or be owned by, other objects. An object owns another object if the objects are in a hierarchical relationship and the owning object is at a higher level than the owned object. Each object may include one or more attributes or properties that are relevant to the model. Properties or attributes typically represent characteristics of the object.

In accordance with the teachings of the present invention, the process of comparing two models results in a collection of comparison nodes that hold information about the comparison. For example, the objects and/or attributes of one model are compared to the objects and/or attributes of a second model and the comparison is stored as a collection of comparison nodes. In this manner, the results of the comparison can be reviewed and/or the models can be brought into some higher level of conformity with one another, as desired by a user.

One way to identify, log and/or correct for deviations between the models is to build scripts that indicate actions to be taken on the nodes of the comparison. For example, the script may include the instruction "in Node 1, move the data from the first model to the second model." The user may build these scripts as the comparison is being reviewed and then the user may execute the scripts in a batch after the user has completed building the scripts. This batch method does not allow for the user to monitor the progress of the modifications to the models as the changes are designated by the user, and does not allow the user to identify any problems and/or inconsistencies with the changes until after the user has indicated all of the changes to be made.

In accordance with a particular embodiment of the present invention, comparison nodes are modeled (i.e., represented as a model) as an object/property model using an underlying modeling engine. One such modeling engine is the ALLFUSION® ERWIN® Data Modeler modeling engine offered by CA Inc. Models within an object/property model are also commonly referred to as graphs. Modeling a comparison model or comparison graph allows for representing similar and dissimilar aspects of the compared models.

In accordance with another embodiment of the present invention, all operations on the two data models, and all operations on the comparison node model (based upon desired changes to one or both models) are performed approximately in real-time, as the changes are designated by the user. This allows the user to view the changes to either of the models as the changes are designated, and allows the user to view an updated version of the comparison node model, as the changes are being designated by the user.

In accordance with yet another embodiment of the present invention, the comparison nodes are modeled using an object/property modeling engine that includes undo/redo capability. This allows the user to undo and/or redo changes in object matching and to undo and/or redo operations performed.

Thus, when comparing differences between two models, the comparison data that is generated is modeled into an object model. All of the changes to the models are synchronous and displayed immediately (e.g., approximately in real-time) upon their designation by the user. This provides for approximately immediate feedback to the user regarding all changes to the models, including those changes that may be caused by modeling rules (e.g., automatically implemented by the system) instead of being specifically identified by the user. The user may also undo and/or redo changes quickly and easily, as objects of the models are compared.

Additional information regarding models and modeling tools is available within U.S. Pat. No. 6,859,919 (the "'919 patent"). The term "model" throughout this specification will include the object/property models implemented in the modeling engine described in the '919 patent.

In accordance with the teachings of the present invention, the modeling engine based upon the '919 patent will include: (i) a notification manager that broadcasts a list of all changes to the model upon successful completion of an operation; and (ii) a transaction manager that allows undo and redo operations to be performed at will.

For purposes of illustration, the present specification will refer to the AllFusion ERwin Data Modeler available from CA, Inc. The AllFusion ERwin Data Modeler includes models which represent DBMS schemas.

In accordance with a particular embodiment of the present invention, models may be represented in IDEF1x format.

Figure 1B:
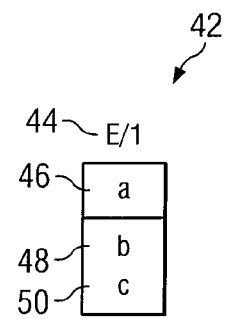
FIG. 1B is an example of a standard object model.

IDLE1x is a standard for diagramming schemas within the Integrated Definition Methods that will be familiar to programmers. FIGS. 1A and 1B illustrate simple schemas in IDEF1x notation. In an IDEF1x model, entities and attributes are types of objects. FIG. 1A shows a schema representation of Model M1 from FIG. 2A Model M1 32 includes a single Entity, E/1 34. Entity E/1 34 includes two Attributes, a 36 and b 38. FIG. 1B shows a schema representation of Model M2 from FIG. 2B. Model M2 42 includes a single Entity, E/1 44. Entity E/1 44 includes three Attributes, a 46, b 48, and c 50. In another embodiment, models may be in XML, flat, or comma-separated format. In short, a model can be in any data schema format comprising a plurality of objects.

In order to bring the models of FIGS. 1A and 1B into conformity, a user could create attribute "C" in the Model of FIG. 1A, or delete attribute "C" from the Model of FIG. 1B.

Within this disclosure, models may also be represented in Unified Modeling Language (UML) format. UML is a standard notation for representing objects and other programming concepts that will be familiar to programmers.

Figure 2A:
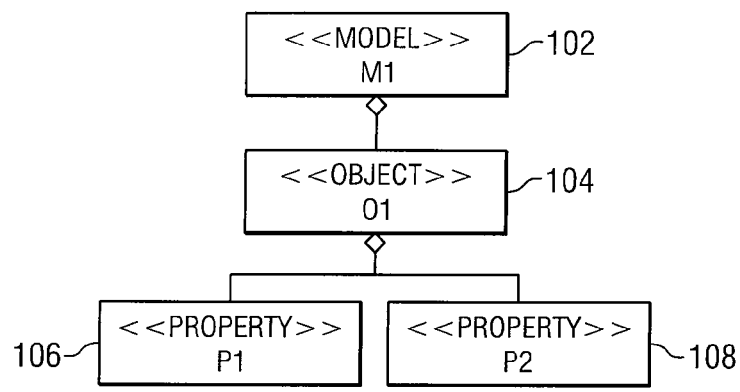
FIG. 2A is an example of a standard object model.
Figure 2B:
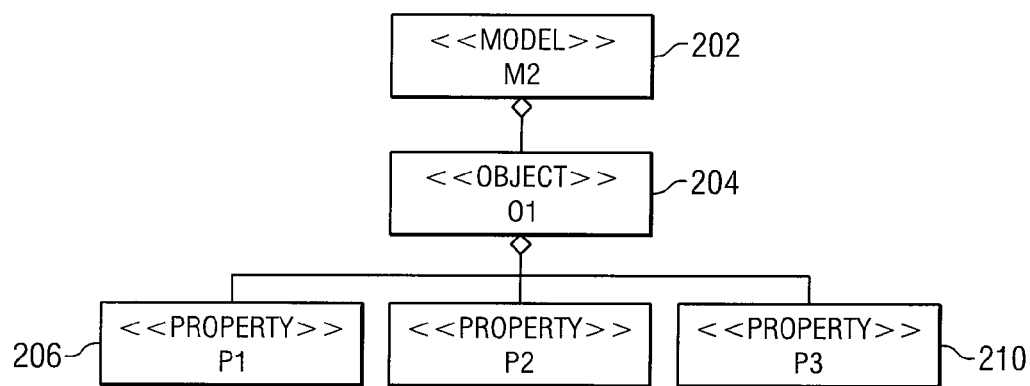
FIG. 2B is an example of a standard object model.

If the models of FIGS. 1A and 1B were to be represented as a set of objects in an ERwin model, they ay appear as in FIGS. 2A and 2B. FIGS. 2A and 2B are simplified representations of the actual data that may be found in ERwin, but they are sufficient for purposes of illustration. FIG. 2A shows a first Model, M1 102. Model M1 102 includes a single Object, O1 104. Object O1 104 includes two Properties, P1 106 and P2 108. FIG. 2B shows a second Model, M2 202. Model M2 202 includes a single Object, O1 204. Object O1 204 includes three Properties, P1 206, P2 208, and P3 210.

As shown in FIG. 2B, Model M2 202 in FIG. 2 differs from Model M1 102 in FIG. 2A by the third Property P3 210. In order to synchronize these two models, Property P3 210 can be added to Model M1 102. Alternatively, Property P3 210 can be removed from Model M2 202. Similar approaches may be used when an object belongs to one model, but does not belong to another model.

Figure 3:
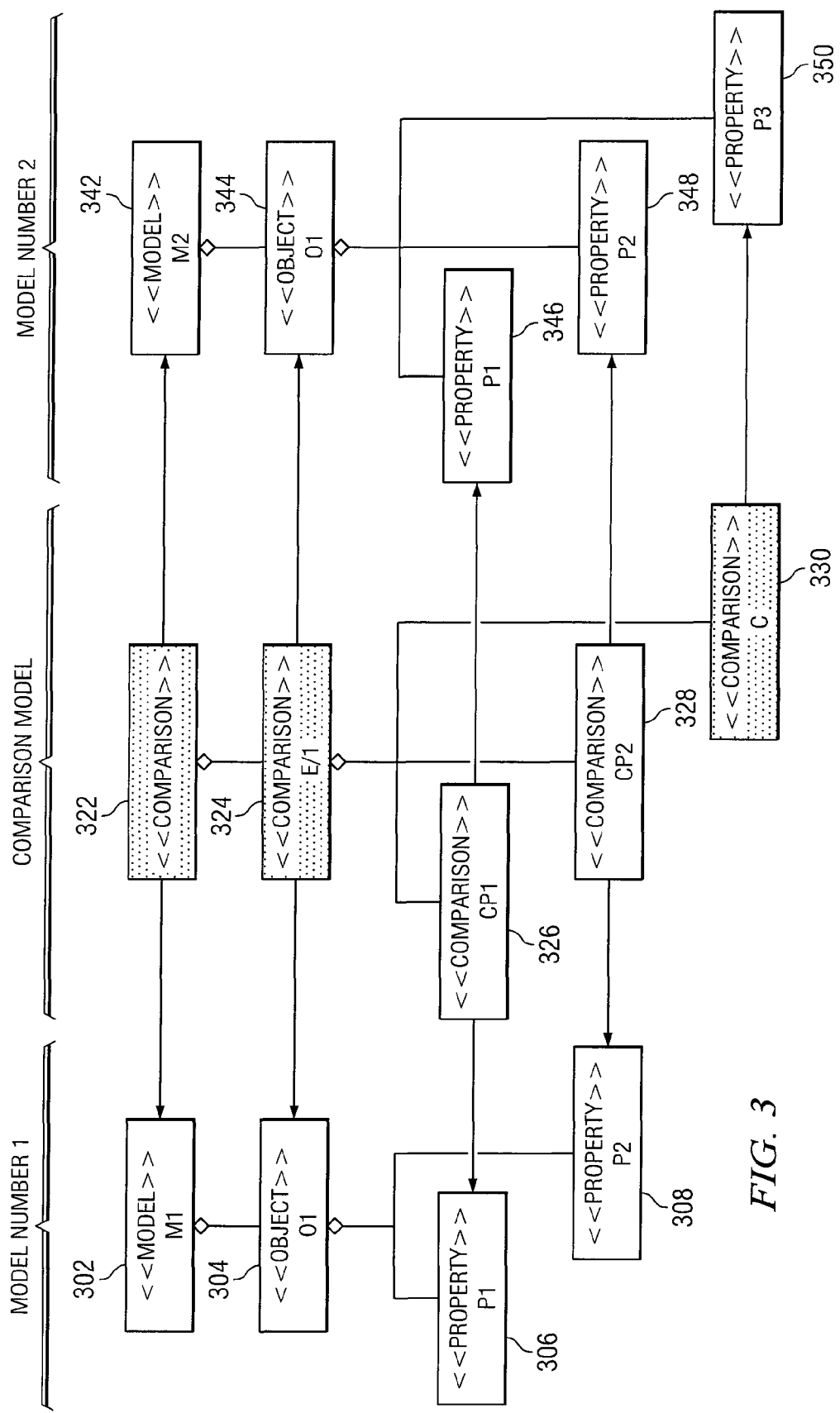
FIG. 3 is an example of an object model with a comparison model between two standard models.

FIG. 3 shows a Comparison Model, CM 322, which contains objects indicating the comparison state between models, objects, and properties. The hierarchy of the objects in Comparison Model CM 322 matches the hierarchy of Models M1 302 and M2 342. The objects in Comparison Model CM 322 hold references to the two models. As shown in FIG. 3, Comparison Model CM 322 contains the comparison state between Models M1 302 and M2 342. Object CO1 324 contains the comparison state for Objects O1 304 and O1 344. Similarly, the Comparison Model CM 322 contains the comparison state for each of the properties in Models M1 302 and M2 342. For illustrative purposes, FIG. 3 shows cross-hatched comparison objects with a comparison state set to "Not Equal."

Figure 4:
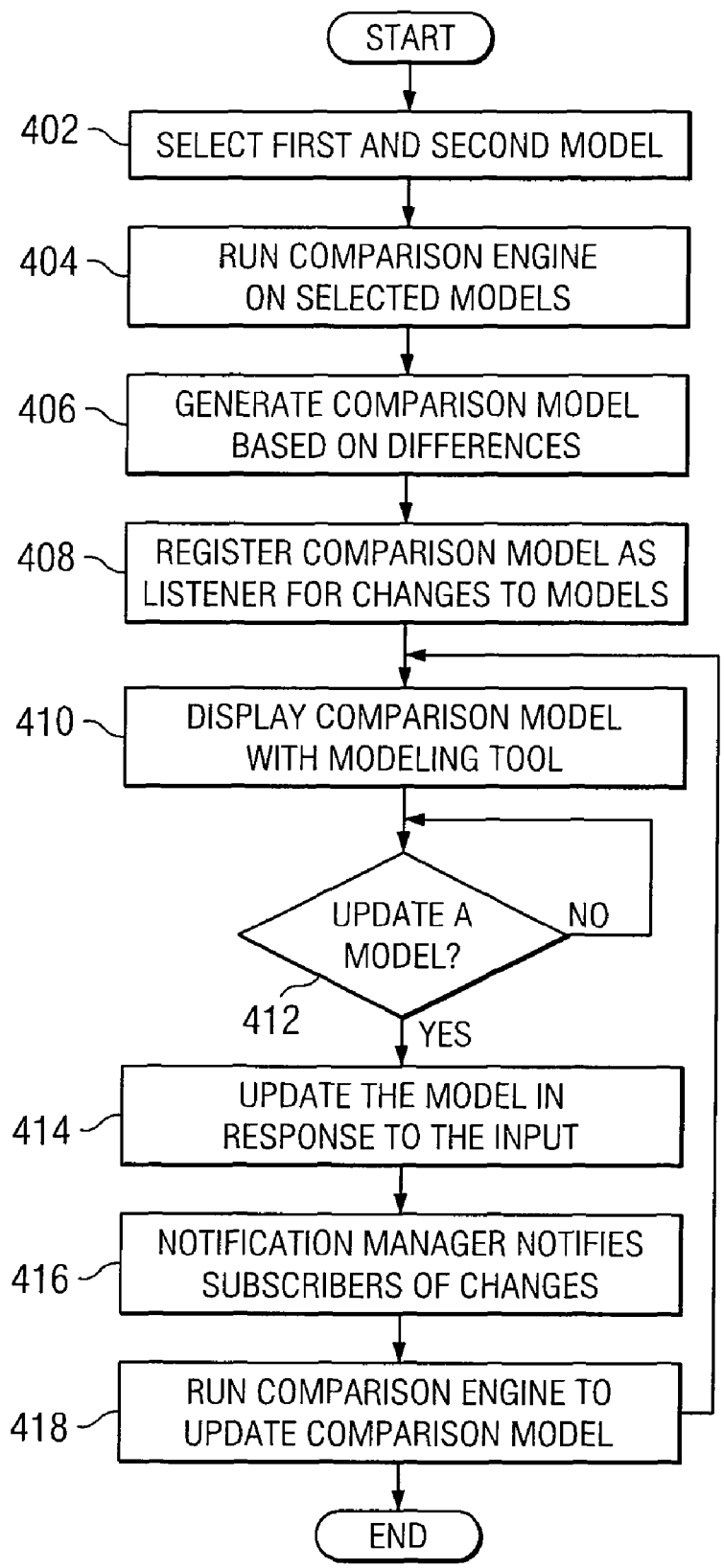
FIG. 4 is a flow diagram for generating a comparison model based on the differences between two models.
Figure 9:
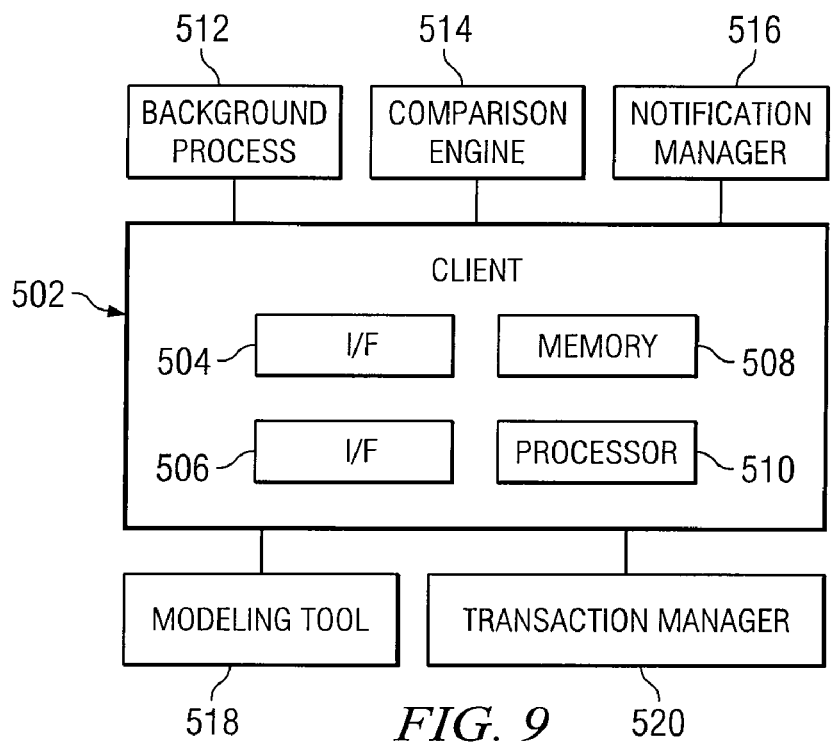
FIG. 9 illustrates a system that incorporates aspects of the present invention.

FIG. 4 is a flow diagram for generating a comparison model based on the differences between two models and FIG. 9 illustrates a system that is operable to implement the method of FIG. 4, and/or other aspects of the teachings of the present invention. In 402, a client 502 (see FIG. 9) initiates the process by selecting two models to compare. The client may include a graphical interface 504, a network interface 506, memory 508, and a processor 510. The present disclosure contemplates many types of clients including a personal computer, a workstation, a personal digital assistant, or any other processing device. In short, client is operable to receive input and/or display output.

For example, in 402, the client may select Models M1 302 and M2 342 for comparison. During the selection process in 402, a background process 512 may run which tracks the selections and display warnings if necessary. For example, if the client selects invalid models for comparison, the client will get an error message.

In 404, a comparison engine 514 compares the two models selected in 402. The comparison engine may comprise of any hardware, software, firmware, logic, or combination thereof operable to compare two or more models, such as the comparison engine disclosed in U.S. Pat. No. 6,385,610 entitled METHOD AND APPARATUS FOR IDENTIFYING AND VISUALIZING DIFFERENCES IN OBJECT MODEL DIAGRAMS. Comparison engine 514 may employ an object-matching algorithm for comparing models. The object-matching algorithm attempts to find a match for selected objects within a model. For example, the object-matching algorithm would recursively traverse Model M1 302 looking for objects and properties. Then the object-matching algorithm would recursively traverse Model M2 342 looking for a match.

In accordance with a particular embodiment of the present invention, matching objects by default in the object-matching algorithm may be overridden. Synchronization is achieved by employing some matching rules into the object-matching algorithm. For example, these rules would match two objects that have the same type and the same name. Object O1 304 in Model M1 304 matches with Object O1 344 in Model M2 342 by that algorithm. However, the client may designate the objects to be compared rather than those chosen by default.

In 406, comparison engine 514 generates a comparison model. The object-matching algorithm of the comparison engine in 404 creates a comparison node for every time it attempts a match. Comparison nodes may contain a comparison state indicating the state of equality between the object or property being compared. Inequality in an owned object implies inequality in the owning object. Therefore, a difference in equality in the comparison states between two properties in two models results in a difference in equality in the owning object and the owning model. For example, Table 1 describes such comparison states between Models M1 302 and M2 342 as these may be viewed if the comparison was accomplished using the "C" programming language.

TABLE 1

| Sample Comparison Results | | |
|---|---|---|
| Model #1 | Comparison State | Model #2 |
| Model M1 | Not Equal | Model M2 |
| Object O1 | Not Equal | Object O1 |
| Property P1 | Equal | Property P1 |
| Property P2 | Equal | Property P2 |
| — | Not Equal | Property P3 |

In 408, the comparison model registers itself as a subscriber to the notification manager 516 of both models. In accordance with the teachings of the present invention, each model may include its own respective notification manager 516, or a single notification manager 516 may handle some or all models. The notification manager may be an implementation of the Observer Pattern described by Erich Gamma, et al, in Design Patterns, a volume commonly referenced by programmers. The Observer Pattern has two elements: the subscriber/observer element and the publisher/subject element. A software component, known as an observer or subscriber, can register itself as wanting notification of events from another software component, known as a subject or publisher. For example, in a modeling framework, Models M1 302 and M2 342 can implement this publisher pattern and notify subscriber CM 322 of all changes that occur.

In 410, a modeling tool 518 displays the comparison model and the compared models. The modeling tool is any modeling tool, application, component, or library operable to use models, such as the modeling tool disclosed in U.S. Pat. No. 6,859,919 entitled OBJECT MODELING TOOL WITH META MODEL SEMANTIC REGISTRY (RULES) A META DATA MANAGER FOR OBJECT(S) PROPERTIES AN OBJECT/PROPERTY INTERFACE FOR INSTANCE (S) OF OBJECTS/PROPERTIES RECEIVED VIA OBJECT/PROPERTY INTERFACE OF THE OBJECT FACTORY REGISTRY. The modeling tool can generate object based models. The modeling tool may comprise a child or subcomponent of another software component, without departing form the scope of this disclosure. The modeling tool represents each comparison node as an object. The comparison node objects have properties allowing identification of the objects in the schemas being compared and another property indicating the comparison state. For example, the modeling tool would display Comparison Model CM 322, Model M1 302, and Model M2 342 in an object model as in FIG. 3.

In 412, the client makes an input operation to update a model. For example, the input operation may be creating Property P3 350 in Model M1 302, therefore synchronizing Models M1 302 and M2 342. In 414, the model is updated in response to the input operation. For example, Model M1 302 is updated by adding Property P3 350 under Object O1 304.

In accordance with a particular embodiment of the present invention, the input operation at step 412 may also be undoing or redoing changes to a model. The modeling tool may include a transaction manager 520 to keep track of each of the models and the actions performed on each model. Transaction manager 520 may accomplish this by logging changes to a log file, obtaining undo data from the log file, and performing an undo operation. For example, if the client reverses changes to a model, the modeling information, including what object is matched with what other object, is subject to a transaction manager. An action to add a new Property P3 350 to Model M1 302 might update Model M1 302 and the Comparison Model CM 322 structure. So undo will use the transaction manager's rollback feature to undo the changes caused by transactions on Model M1 302 and the Comparison Model CM 322 structure.

In 416, the notification manager 516 publishes an event notifying all subscribers of the update. And the comparison model would receive the event notification. For example, Model M1 302 would publish an event indicating that Object O1 304 was modified to contain a new Property P3 350.

Figure 5:
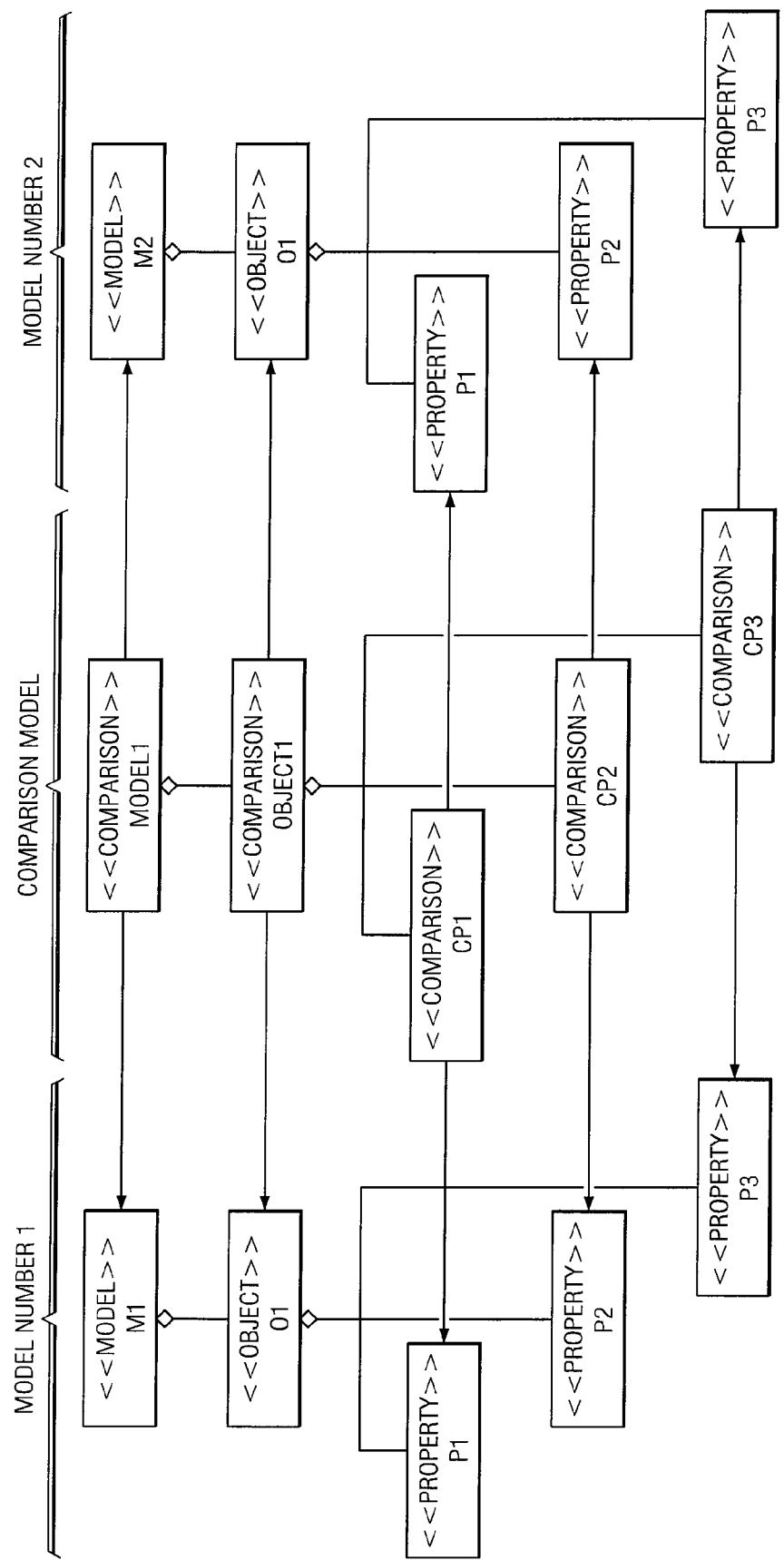
FIG. 5 is an example of an updated object model with a comparison model between two standard models.

In 418, the comparison engine runs again to update the comparison model. For example, the comparison engine would re-compare Model M1 302 and Model M2 342 and update the equality states of Comparison Model CM 322. The object-matching algorithm would determine that the new Property P3 in Model M1 302 should be matched to Property P3 350 in Model M2 342. Next, it would locate the ObjectCO1 304 and update it with a reference to the new Property P3 in Model M1 302. Thus, Models CM, M1, and M2 are updated immediately and displayed to the client. The resulting model might be displayed as in FIG. 5.

The system of FIG. 9 and each component thereof may comprise hardware, software and/or logic encoded in media that is capable of implementing the method of FIG. 4 and/or other aspects of the teachings of the present invention.

The immediate update and display of results can be beneficial particularly when side effects are possible. For example, consider the ERwin model of FIG. 6. This represents the addition of a second entity, 'E/3', existing in a child relationship to 'E/1'. In IDEF1x, attributes drawn above the middle line in an entity represent key attributes. IDEF1x modeling rules require all key attributes to be copied to child entities when a relationship exists. For that reason, 'E/3' contains attribute 'a' (the (FK) designation indicates that it is copied down).

Figure 7:
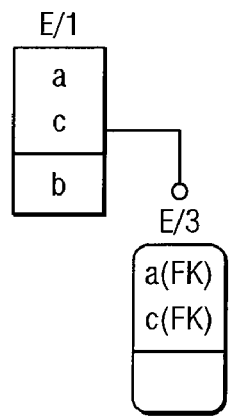
FIG. 7 illustrates a modified version of the standard object model of FIG. 6.

Another IDEF1x rule requires that no two attributes have the same name-if they have the same name they must be merged into a single attribute. The rules for merging state that merging a key attribute and a non-key attribute results in a key attribute. Therefore, the addition of an attribute 'c' to the key of 'E/1' would result in a change to 'E/3' as represented in the FIG. 7.

Figure 6:
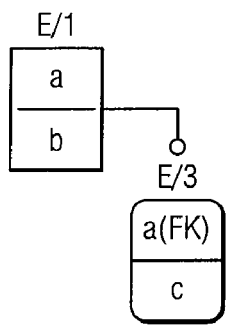
FIG. 6 illustrates a standard object model.
Figure 8:
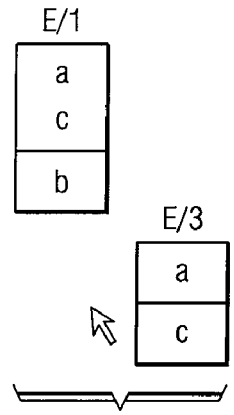
FIG. 8 illustrates an alternative standard object model.

Now consider the model represented in FIG. 8 in comparison to the original state of the model of FIG. 6. Prior to any operations, the presence of attribute 'c' renders the two 'E/1' entities different, but the two 'E/3' entities are equal.

The import of attribute 'c' to the model of FIG. 6 will make the 'E/1' entities equal, but will have the side-effect of making the 'E/3' entities unequal. Prior to this invention, this fact could have remained undetected. Even if it were detected, there was no efficient way to fix the problem. In accordance with the teachings of the present invention, the side-effect is detected immediately and displayed.

Users also have the ability in Complete Compare to override the default matching of objects. Complete Compare employs some matching rules coded into the module. For instance, these rules would match two objects that have the same type and the same name. In our examples above, entity 'E/1' of FIG. 2A was matched to entity 'E/1' of FIG. 2B by that algorithm. However, the user has the ability to designate the objects should correctly be compared to objects other than the one chosen by default. If the user changes his mind once this operation is performed, the old architecture required him to reverse the designation manually. Under the proposed architecture the modeling information, including what object is matched with what other object, is subject to the transaction manager. This means that operations can be undone automatically.

Although the present invention has been described with several embodiments, a myriad of changes, variations, alterations, transformations, and modifications as fall within the scope of the appended claims.

What is claimed is:

1. A method for comparing models, comprising:
using a computer to compare first and second models;
using the computer to generate a comparison model comprising each object of the first and second models, the comparison model indicating differences between the first model and the second model, the comparison model comprising a comparison node for each object of the first and second models, each comparison node including a comparison state indicating a state of equality or inequality between the first and second models for a particular object;
using a notification manager to register the comparison model as a subscriber of the first and second models;
updating the first model to reflect a designated change;
upon successful completion of the first designated change to an object of the first model, using the notification manager to issue a notification of the designated change to the comparison model;
in response to each modification of an object in the first model, using the computer to synchronously update in real time the comparison model and the second model to reflect the first designated change for a substantially synchronous modification of the first, second, and comparison models; and displaying the comparison model on a client.

2. The method of claim 1, wherein:

the first designated change comprises a first user designated change; and the comparison model is updated to reflect the first user designated change before receiving a second user designated change.

3. The method of claim 2, further comprising storing the first and second user designated changes to allow the user to undo the first user designated change or the second user designated change, upon command from the user.

4. The method of claim 3, further comprising storing information regarding ones of the first or second user designated changes that were undone, to allow the user to redo ones of the first or second user designated changes that were undone, upon command from the user.

5. The method of claim 1, wherein the first and second models, and the comparison model comprise models of the Unified Modeling Language (UML) format.

6. The method of claim 1, wherein the comparison model comprises a plurality of comparison nodes, each comparison node being represented as an object of the comparison model.

7. A system for comparing models, comprising:

a computer comprising a comparison engine operable to compare first and second models; and the computer further comprising a modeling tool for:

registering the comparison model as a subscriber of the first and second models with a notification manager;

generating a comparison model comprising, each object of the first and second models, the comparison model indicating the differences between the first model and the second model, the comparison model comprising a comparison node for each object of the first and second models, each comparison node including a comparison state indicating a state of equality or inequality between the first and second models for a particular object;

updating the first model to reflect a first designated change;

upon successful completion of the first designated change to an object of the first model, using the notification manager to issue a notification of the designated change to the comparison model;

in response to each modification of an object in the first model, synchronously updating in real time the comparison model and the second model to reflect the first designated change for a substantially synchronous modification of the first second, and comparison models; and displaying the comparison model on a client.

8. The system of claim 7, wherein:

the first designated change comprises a first user designated change; and the modeling tool is further operable to update the comparison model to reflect the first user designated change before receiving a second user designated change.

9. The system of claim 8, further comprising a transaction manager being operable to store the first and second user designated changes to allow the user to undo the first user designated change or the second user designated change, upon command from the user.

10. The system of claim 9, further comprising memory being operable to store information regarding ones of the first or second user designated changes that were undone, to allow the user to redo ones of the first or second user designated changes that were undone, upon command from the user.

11. The method of claim 7, wherein the first and second models, and the comparison model comprise models of the Unified Modeling Language (UML) format.

12. The method of claim 7, wherein the comparison model comprises a plurality of comparison nodes, each comparison node being represented as an object of the comparison model.

13. A method for generating a dynamic comparison model, comprising receiving, by a computer, a first model and a second model;

using the computer to run a comparison engine on the first model and the second model;

using the computer to generate a comparison model comprising each object of the first and second models, the comparison model indicating differences between the first model and second model, the comparison model comprising a comparison node for each object of the first and second models, each comparison node including a comparison state indicating a state of equality or inequality between the first and second models for a particular object;

registering the comparison model as a subscriber to the first model and the second model in a notification manager, wherein the notification manager notifies all subscribers of changes that occur to the first or second model;

displaying the comparison model using a modeling tool;

receiving an input operation to modify an object of the first model;

updating the first model in response to the input operation;

notifying the notification manger in response to the input operation; and in response to each modification of an tied in the first model, using the computer to substantially synchronously update in real time the comparison model and the second model for a synchronous modification of the first, sec ad, and comparison models.

14. A system for generating a dynamic comparison model, comprising:

a computer executing an interface for receiving a first model and a second model;

the computer comprising:

a comparison engine for running a comparison on the first model and the second model;

a modeling tool for generating a comparison model comprising each object of the first and second models, the comparison model indicating differences between the first model and second model, the comparison model comprising a comparison node for each object of to first and second models, each comparison node including a comparison state indicating a state of equality or inequality between the first and second models for a particular object;

a notification manager for registering the comparison model as a subscriber to she first model and the second model, wherein the notification manager notifies alt subscribers of changes that occur to the first or second model; and a graphical display for displaying the comparison model using the modeling tool; and wherein the modeling tool is further for:

updating the first model to reflect a first designated change;

upon successful completion of the first designated change to an object of the first model, using the notification manager to issue a notification of the designated change to the comparison model; and in response to each modification of an object in the first model, synchronously updating in real time the comparison model and the second model to reflect the first designated change for a substantially synchronous modification of the first, second, and comparison models.

15. The system of claim 14, wherein:

the first designated change comprises a first user designated change; and the comparison model is updated to reflect the first user designated change before receiving a second user designated change.

16. A system, comprising:

means for comparing first and second models;

means for generating a comparison model comprising each object of the first and second models, the comparison model indicating differences between the first model and the second model, the comparison model comprising a comparison node for each object of the first and second models, each comparison node including a comparison state indicating a state of equality or inequality between the first and second models for a particular object;

means for using a notification manager to register the comparison model as a subscriber of the first and second models;

means for updating the first model to reflect a first designated change;

upon successful completion of the first designated change to an object of the first model, means for using the notification manager to issue a notification of the designated change to the comparison model;

means for synchronously updating, in real time and in response to each modification of an object in the first model, the comparison model and the second model to reflect the first designated change for a substantially synchronous modification of the first, second, and comparison models; and means for displaying the comparison model on a client.

17. Logic stored in a memory, the logic being operable when executed by a computer to:

compare first and second models;

generate a comparison model comprising each object of the first and second models, the comparison model indicating differences between the first method and the second model, the comparison model comprising a comparison node for each object of the first and second models, each comparison node including a comparison state indicating a state of equality or inequality between the first and second models for a particular object;

use a notification manager to register the comparison model as a subscriber of the first and second models;

update the first model to reflect a first designated change;

upon successful completion of the first designated change to an object of the first model, use the notification manager to issue a notification of the designated change to the comparison model;

in response to each modification of an object in the first model, synchronously update in real time the comparison model and the second model to reflect the first designated change for a substantially synchronous modification of the first, second, and comparison models; and display the comparison model on a client.

18. The method of claim 13, wherein:

the first designated change comprises a first user designated change; and the comparison model is updated to reflect the first user designated change before receiving a second user designated change.

19. The system of claim 16, wherein:

the first designated change comprises a first user designated change; and the comparison model is updated to reflect the first user designated change before receiving a second user designated change.

20. The logic of claim 17, wherein:

the first designated change comprises a first user designated change; and the comparison model is updated to reflect the first user designated change before receiving a second user designated change.

* * * * *